United States Patent [19]

Brooks et al.

[11] Patent Number: 5,410,664
[45] Date of Patent: Apr. 25, 1995

[54] RAM ADDRESSING APPARATUS WITH LOWER POWER CONSUMPTION AND LESS NOISE GENERATION

[75] Inventors: William O. Brooks, Aloha; Gary Brady, Portland; David Ellis, Hillsboro, all of Oreg.

[73] Assignee: Intel Corporation, Santa Clara, Calif.

[21] Appl. No.: 40,667

[22] Filed: Mar. 31, 1993

[51] Int. Cl.⁶ .................. G06F 12/02; G11C 8/00
[52] U.S. Cl. .................... 395/400; 395/425; 365/221; 365/230.03; 365/239
[58] Field of Search .............. 395/400, 425; 365/230.09, 239, 221, 230.03

[56] References Cited

U.S. PATENT DOCUMENTS

| | | | |
|---|---|---|---|
| 3,781,808 | 12/1973 | Ahearn et al. | 395/400 |
| 4,556,960 | 12/1985 | Cohn et al. | 395/400 |
| 4,638,481 | 1/1987 | Crane et al. | 371/27 |
| 5,109,334 | 4/1992 | Kamuro | 395/400 |
| 5,115,413 | 5/1992 | Sato et al. | 365/230.09 |
| 5,274,788 | 12/1993 | Koike | 395/425 |
| 5,278,962 | 1/1994 | Masuda et al. | 395/400 |
| 5,329,629 | 7/1994 | Horst et al. | 395/400 X |

*Primary Examiner*—Jack B. Harvey
*Assistant Examiner*—Michael A. Whitfield
*Attorney, Agent, or Firm*—Balkely, Sokoloff, Taylor & Zafman

[57] ABSTRACT

An address converter that reduces the number of address bit changes between successive sequential addresses is provided to a RAM address bus for a sequentially accessed RAM. In the presently preferred embodiment, the address converter comprises a plurality of XOR gates for converting the access addresses into gray coded access addresses having at most one address bit change between successive access addresses. As a result, the power consumed and the noise generated over the address bus is reduced, thereby conserving power available and minimizing device package pins required by the digital system having the RAM and the RAM address bus.

12 Claims, 6 Drawing Sheets

| GENERATED ADDRESS | CONVERTED ADDRESS |
|---|---|
| 1FFFE | 10001 |
| 1FFFF | 10000 |
| 00000 | 00000 |
| 00001 | 00001 |

*Figure 5*

| SRAMSIZE | ACTIVE G | BANK |
|---|---|---|
| 0 0 | G[12:0] | 8K |
| 0 1 | G[14:0] | 32K |
| 1 X | G[16:0] | 128K |

*Figure 6*

RAM ADDRESSING APPARATUS WITH LOWER POWER CONSUMPTION AND LESS NOISE GENERATION

BACKGROUND OF THE INVENTION

1. Field of the Invention

The present invention relates to the field of digital systems, in particular, digital systems having embedded random access memory (RAM) including general and special purpose computer systems. More specifically, the present invention relates to the addressing apparatus provided on these digital systems for providing access addresses to the embedded RAM.

2. Background

Reduction of power consumption has become increasingly important for the design of compact digital systems having a very large number of integrated electronics, such as microprocessor-based and battery-powered computer systems. Reduction of power consumption not only conserve the power available thereby extending the operating life of battery-powered digital systems between recharges, it also reduces the number of power and ground pins required thereby reducing device package pin requirements.

In the case of microprocessor-based and battery-powered computer systems, a number of approaches to reduce power consumption has been developed in the industry. For example, the Intel ® 80×86 microprocessors provide a transparent system management interrupt and an elaborate list of affiliated hardware/software controls for selectively shutting down idle peripheral devices and suspending system operation to reduce power consumption and conserve power. For further description of system and power management under the Intel ® 80×86 microprocessors, see various product literature provided by Intel Corporation of Santa Clara, Calif.

However, the problem of reducing power consumption or minimizing device package pins is never totally solved. Additional reduction is always desirable as long as it is cost effective, not just economically, but also from the perspective of hardware real estate cost. Since digital systems having embedded RAM typically have multiple banks of RAM, and the RAM are constantly addressed through one or more address buses, even a small amount of reduction in power consumption for each addressing of the RAM can result in a significant amount of reduction in power consumption by the address buses. In turn, a significant amount of power would be conserved, and a significant number of device package pins will be eliminated.

Typically, one or more banks of the RAM are dedicated to functions that will access them only in a sequential manner. A particular example of such dedicated RAM is RAM used exclusively for tracing on a digital data instrumentation system. Even for the RAM that are not exclusively accessed in a sequential manner, inevitably at one time or another, a series of accesses to an area of the RAM will be made sequentially. Both of these situations, due to the inherent characteristics of sequential accesses, provide yet another opportunity for reducing power consumption by the digital system. As will be disclosed, the RAM addressing apparatus of the present invention reduces its power consumption by exploiting the inherent characteristics of sequential accesses, thereby achieving the above described desirable results of further enhancement in power conservation and device package pin reduction. As will be obvious from the description to follow, the RAM addressing apparatus of the present invention has particular application to microprocessor-based and battery-powered computer systems.

SUMMARY OF THE INVENTION

The advantageous results are achieved by providing an address converter to the RAM addressing apparatus that reduces the number of address bit changes between successive sequential addresses. The address converter intercepts the access addresses from the address generator of the RAM addressing apparatus, and converts them to corresponding addresses with reduced number of address bit changes in a predetermined manner, before issuing the converted addresses to the RAM. As a result of the reduced address bit changes between successive sequential addresses, the power consumed and the noise generated by the address bus are reduced, thereby further conserving power. The reduction in power consumption also leads to a reduction in the number of power and ground pins required, thereby further reducing the device package pin requirement.

In the presently preferred embodiment, the address converter comprises a plurality of Exclusive-OR (XOR) gates which cooperate to convert the access addresses into gray coded access addresses having at most one address bit change between successive access addresses, and forward the converted access addresses to the RAM. Additionally, the address converter further comprises at least one OR gate and a plurality of AND gates for tailoring the address converter for different sizes of access addresses for different sizes of RAM.

BRIEF DESCRIPTION OF THE DRAWINGS

The objects, features, and advantages of the present invention will be apparent from the following detailed description of the presently preferred and alternate embodiments of the invention with references to the drawings in which:

FIG. 5 illustrates a plurality of exemplary address conversions under the present invention.

FIG. 6 illustrates an exemplary mapping and selection of the XOR gates of FIG. 4 for different RAM sizes.

DETAILED DESCRIPTION PRESENTLY PREFERRED AND ALTERNATE EMBODIMENTS

In the following description, for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Figure 1:
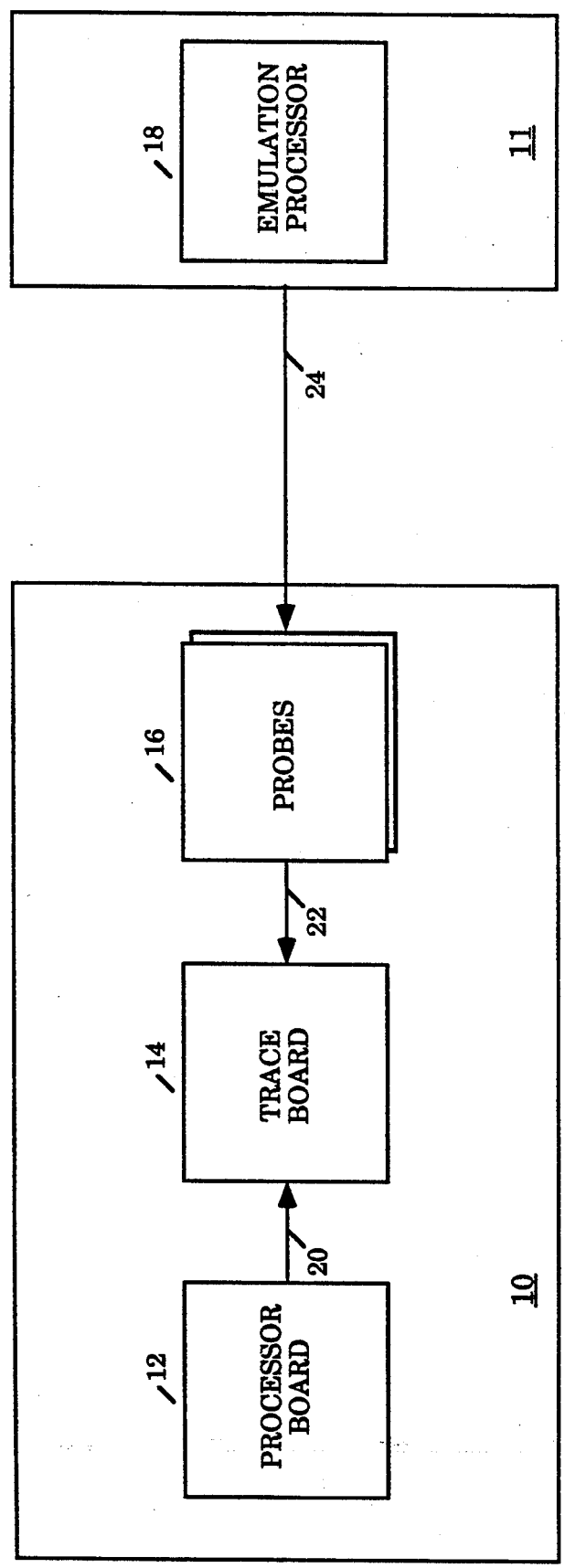
FIG. 1 illustrates an exemplary digital system having embedded RAM incorporated with the teachings of the present invention.

Referring now to FIG. 1, a block diagram illustrating an exemplary digital system having embedded RAM incorporated with the teachings of the present invention is shown. Shown is an exemplary data instrumentation system 10 incorporated with the teachings of the present invention coupled to a target system 11 for monitoring, acquiring data, and controlling the target system 11. The exemplary data instrumentation system 10 comprises a processor board 12, a trace board 14 incorporated with the teachings of the present invention, and a number of probes 16, while the target system 11 comprises an emulation processor. The processor board 12 and the trace board 14 are coupled to each other, for example, through a parallel bus 20. The trace board 14 comprises a number of banks of RAM addressed through a number of RAM address buses and addressing apparatus of the present invention. The probes 16 are coupled to the trace board 14 and the emulation processor 18. The trace board 14, its RAM and address buses and addressing apparatus will be described below in further detail with additional references to the remaining figures. The processor board 12, the probes 16, and the emulation processor 18 are intended to represent a broad category of these elements found in many data instrumentation and target systems. Their constitutions and functions are well known and will not be further described.

While the present invention is being described with RAM of a trace board, based on the description to follow, it will be appreciated that the present invention may be practiced with RAM used for other non-trace functions. Additionally, while the present invention is being described with an exemplary data instrumentation system, similarly, it will be appreciated that the present invention may be practiced with other digital systems including general and special purpose computer systems, in particular, microprocessor based and battery powered computer systems.

Figure 2:
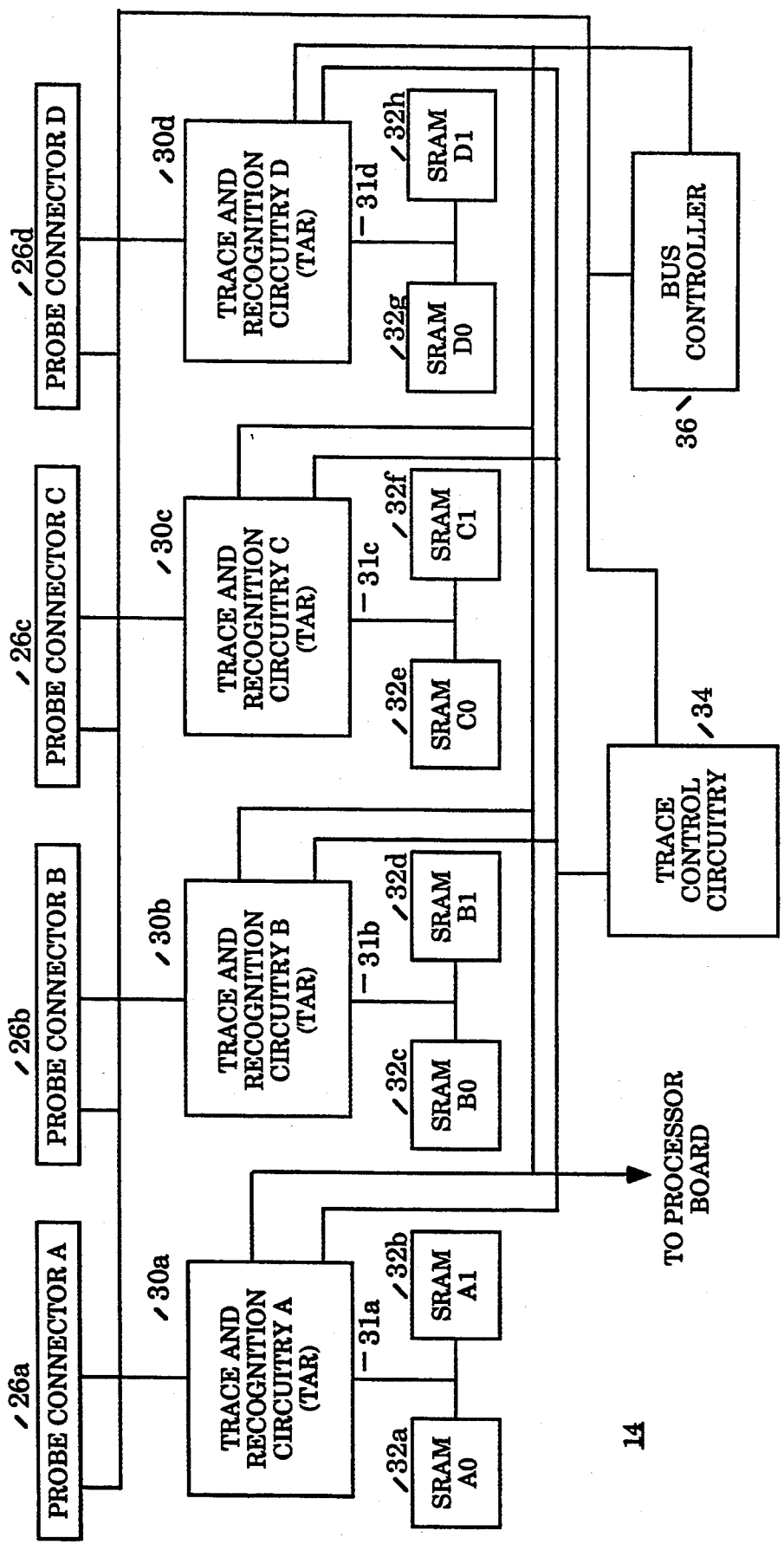
FIG. 2 illustrates the trace board of FIG. 1 incorporated with the teachings of the present invention in further detail.

Referring now to FIG. 2, a block diagram illustrating the trace board of FIG. 1 in further detail is shown. The trace board 14 comprises a plurality of trace and recognition circuitry (TAR) 30a–30d, each having two banks of RAM 32a–32h. The RAM 32a–32h are coupled to the TARs 30a–30d through the RAM address buses 31a–31d. The RAM 32a–32h are accessed by the TARs 30a–30d sequentially. The TARs 30a–30d incorporate addressing apparatus of the present invention. The trace board 14 further comprises a number of probe connectors 26a–26d, a bus controller 36, and trace control circuitry 34. The probe connectors 26a–26d, the bus controller 36, and the trace control circuitry 34 are all coupled to the TARs 30a–30d. Additionally, the probe connectors 26a–26d are also coupled the bus controller 36 and the trace control circuitry 34. The RAM addressing apparatus will be described below in further detail with additional references to the remaining figures. The TARs 30a–30d, the RAM 32a–32h, the probe connectors 26a–26d, the bus controller 36, and the trace control circuitry 34 are intended to represent a broad category of these elements found in many trace boards. Their constitutions and functions are well known and will not be further described.

While the present invention is being described with RAM that are always accessed in a sequential manner, based on the description to follow, it will be appreciated that, with additional access mode control, the present invention may be practiced with RAM that are accessed in a sequential manner some of the time, such as cache memory, first-in first-out (FIFO) and last-in first-out (LIFO).

Figure 3:
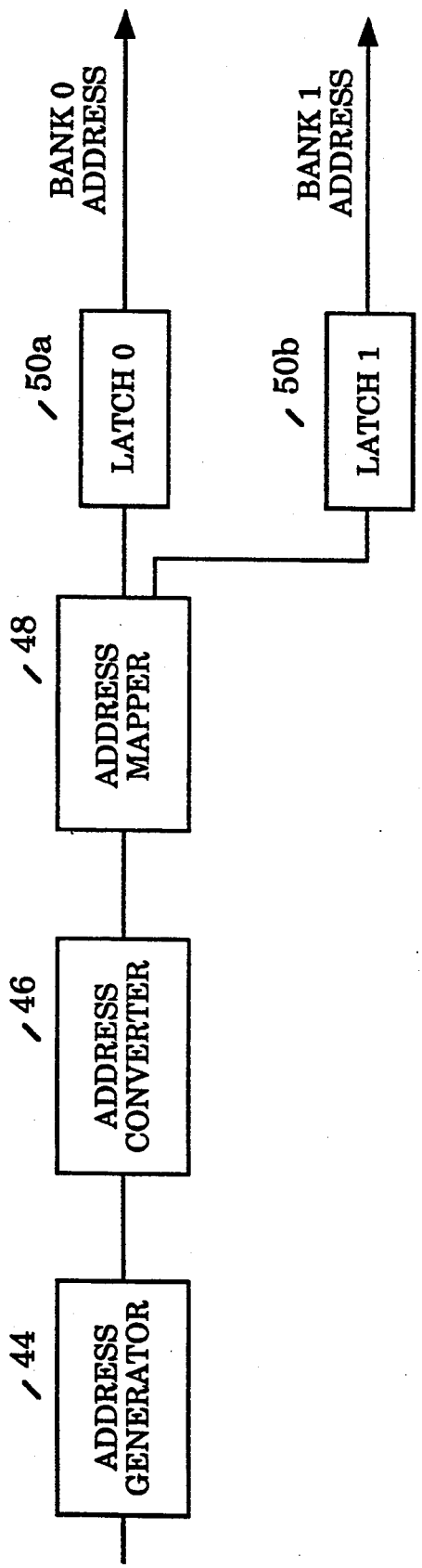
FIG. 3 illustrates the addressing apparatus of the present invention in further detail.

Referring now to FIG. 3, a block diagram illustrating one embodiment of the reduced power and noise RAM addressing apparatus of the present invention of FIG. 2 in further detail is shown. Each RAM addressing apparatus comprises an address generator 44, an address converter 46, an address mapper 48, and two latches 50a–50b, one for each bank of RAM. These elements, 44–48 and 50a–50b, are serially coupled to each other. The address generator 44 generates sequential access addresses. The address converter 46 intercepts the generated sequential access addresses, and converts them into corresponding access addresses with reduced number of address bit changes between successive access addresses, before issuing the converted access addresses to the RAM. The address mapper 48 and the latches 50a–50b map the converted access addresses to the two banks of RAM. As a result of the reduced number of address bit changes between successive access addresses, the power consumed and the noise generated by the addressing apparatus reduced. In turn, the power available to the data instrumentation system is conserved, and the number of device package pins required are reduced. Since there are a number of trace RAM address buses and the RAM are constantly accessed when trace is turned on, thus the accumulated amount of power conservation and reduction in device package pins by the address buses of the present invention are significant. The address converter 46 will be described below in further detail with additional references to the remaining figures. The address generator 44, the address mapper 48, and the latches 50a–50b, are intended to represent a broad category of these elements found in many digital systems. Their constitutions and functions are well known and will not be described further.

While the present invention is being described with an embodiment having an address mapper 48 and latches 50a–50b for mapping access addresses to the corresponding banks of RAM, it will be appreciated that the present invention may be practiced without the address mapper 48 and latches 50a–50b, or with other equivalent circuitry for distributing the accesses among the various banks of RAM.

Figure 4:
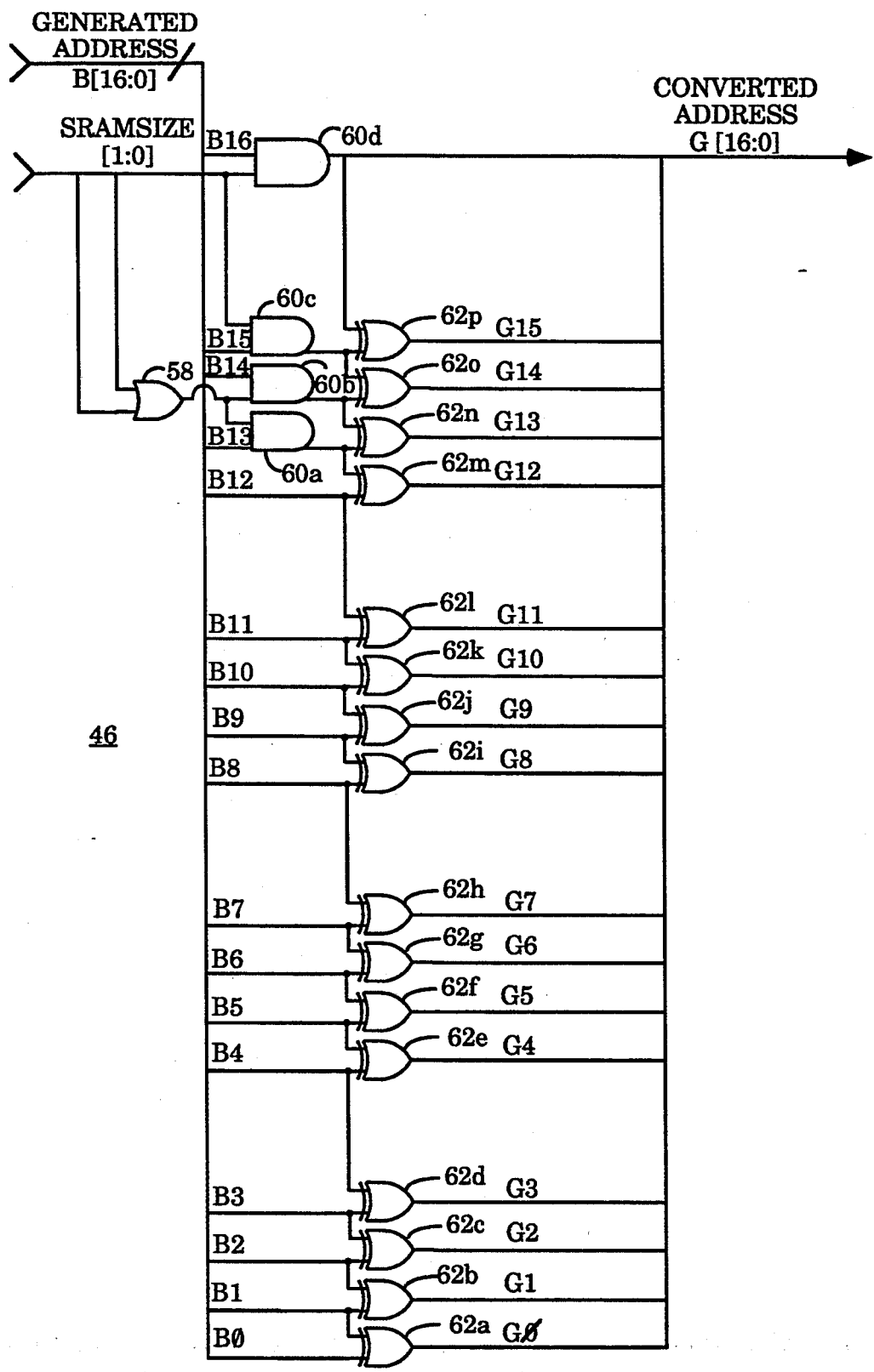
FIG. 4 illustrates the presently preferred embodiment of the address converter of the addressing apparatus of the present invention in further detail.

Referring now to FIG. 4, a block diagram illustrating the presently preferred embodiment of the address converter 46 of FIG. 3 is shown. The presently preferred embodiment of the address converter 46 comprises a plurality of Exclusive-OR (XOR) gates 62a–62p for converting the access addresses to gray coded access addresses with at most one address bit change between successive access addresses. The highest order bit of the converted gray coded access address is set to equal the highest order bit of the access address. Each of the remaining lower order bits of the converted gray coded access address is derived by performing an XOR operation against the corresponding bit and the corresponding bit's next higher order bit of the access address. In other words, the second highest order bit of the converted gray coded access address is derived by performing an XOR operation against the highest and the second highest order bits of the access address; the third highest order bit of the converted gray coded access address is derived by performing an XOR operation against the second highest and the third highest order bits of the access address, and so forth. Since the RAM is being accessed sequentially, the number of address bit change between successive converted gray coded access address is at most one. A number of exemplary sequential access addresses and their corresponding converted gray coded access addresses under the present invention are shown in FIG. 5. As illustrated, there is at most one address bit change between successive converted access addresses. Since the number of address bit change between successive access addresses is at most one, the power consumption and noise generated over the presently preferred embodiment of the address bus 46 is reduced to the best case under the present invention.

Additionally, the address converter 46 further comprises at least one OR gate 58, and a plurality of AND gates 60a–60d coupled to the OR gate 58 for selectively disabling a number of the XOR gates 62a–62c. The ability to selectively disable a number of the XOR gates 62a–62c also enhances the flexibility of the address bus of the present invention, allowing it to accommodate different sizes of access addresses for different sizes of RAM. An exemplary mapping and selection of the XOR gates 62a–62p for different RAM sizes is shown in FIG. 6. As illustrated, the exemplary SRAMSIZE values "00", "01", and "1x" select the first thirteen, fifteen, and seventeen XOR gates 62a–62p for RAM sizes 8K, 32K, and 128K respectively.

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claimed is:

1. In a digital system comprising a plurality of banks of random access memory (RAM), an improved RAM addressing apparatus with reduced power consumption and noise generation for addressing said banks of RAM, thereby conserving power available to said digital system and reducing device package pins required for said digital system, said improved RAM addressing apparatus comprising:
  a) address generation means for generating sequential access addresses addressing said banks of RAM, each of said sequential access addresses comprising a plurality of address bits;
  b) address conversion means coupled to said address generation means for intercepting said generated sequential access addresses, converting said intercepted sequential access addresses in totality into sequential access addresses with reduced number of address bit changes between successive access addresses;
  c) address mapping means coupled to said address conversion means for receiving said converted sequential access addresses, and distributively mapping said received converted sequential access addresses to said banks of RAM; and
  d) a plurality of latches coupled to said address mapping means and correspondingly coupled to said banks of RAM for latching said distributively mapped converted sequential access addresses, and correspondingly providing the latched converted sequential access addresses to said banks of RAM.

2. The improved RAM addressing apparatus as set forth in claim 1, wherein, said address conversion means comprises (b.1) a plurality of XOR gates coupled to said address generation means for receiving said generated sequential access addresses, and converting said sequential access addresses into sequential access addresses with at most one address bit change between successive access addresses.

3. The improved RAM addressing apparatus as set forth in claim 2, wherein, said address conversion means further comprises (b.2) an assembly of at least one AND gate coupled to said XOR gates for selectively disabling a subset of said XOR gates, thereby allowing said address converter to convert sequential access addresses of different sizes for RAM of different sizes.

4. In a digital system comprising a plurality of banks of random access memory (RAM), an improved method for addressing said banks of RAM that consumes less power and generates less noise, thereby conserving power available to said digital system and reducing device package pins required for said digital system, said improved method comprising the steps of:
  a) generating sequential access addresses addressing said banks of RAM, each of said sequential access addresses comprising a plurality of address bits; and
  b) receiving said generated sequential access addresses, converting said intercepted sequential access addresses in totality into sequential access addresses with reduced number of address bit changes between successive access addresses, and outputting said converted sequential access addresses;
  c) receiving said converted sequential access addresses, and distributively mapping said converted sequential access addresses to said banks of RAM; and
  d) latching said distributively mapped converted sequential access addresses, and providing the latched distributively mapped converted sequential access addresses to said banks of RAM.

5. The improved method as set forth in claim 4, wherein, each of said conversion of said received sequential access addresses in said step b) comprises performing a plurality XOR operations against each received access address in a predetermined manner to convert the access address into an access address with at most one address bit changed from its predecessor access address.

6. The improved method as set forth in claim 5, wherein, said step b) further comprises the preliminary step of selecting the number of XOR operations to be performed, thereby allowing sequential access addresses of different sizes to be converted for RAM of different sizes.

7. In a data instrumentation system comprising a trace board having a plurality of banks of random access memory (RAM), an improved RAM addressing apparatus with reduced power consumption and noise generation for addressing said banks of RAM of said trace board, thereby conserving power available to said data instrumentation system and reducing device package pins required for said data instrumentation system, said improved RAM addressing apparatus comprising:
  a) an address generator for generating sequential access addresses addressing said banks of RAM of said trace board, each of said sequential access addresses comprising a plurality of address bits; and b) address converter coupled to said address generator for intercepting said generated sequential access addresses, converting said intercepted sequential access addresses in totality into sequential access addresses with reduced number of address bit changes between successive access addresses;

c) address mapping means coupled to said address conversion means for receiving said converted sequential access addresses, and distributively mapping said received converted sequential access addresses to said banks of RAM; and d) a plurality of latches coupled to said address mapping means and correspondingly coupled to said banks of RAM for latching said distributively mapped converted sequential access addresses, and correspondingly providing the latched converted sequential access addresses to said banks of RAM.

8. The improved RAM addressing apparatus as set forth in claim 7, wherein, said address converter comprises a plurality of XOR gates coupled to said address generator for receiving said generated sequential access addresses, and converting said sequential access addresses into sequential access addresses with at most one address bit change between successive access addresses.

9. In a data instrumentation system comprising a trace board having a plurality of banks of random access memory (RAM), an improved method for addressing said banks of RAM of said trace board that consumes less power and generates less noise, thereby conserving power available to said data instrumentation system and reducing device package pins required for said data instrumentation system, said improved method comprising the steps of:

a) generating sequential access addresses addressing said banks of RAM of said trace board, each of said sequential access addresses comprising a plurality of address bits; and b) receiving said generated sequential access addresses, converting said received sequential access addresses into sequential access addresses with reduced number of address bit changes between successive access addresses;

c) receiving said converted sequential access addresses, and distributively mapping said converted sequential access addresses to said banks of RAM; and d) latching said distributively mapped converted sequential access addresses, and providing the latched distributively mapped converted sequential access addresses to said banks of RAM.

10. The improved method as set forth in claim 9, wherein, each of said conversion of said received sequential access addresses in said step b) comprises performing a plurality XOR operations against each received access address in a predetermined manner to convert the access address into an access address with at most one address bit changed from its predecessor access address.

11. A data instrumentation system comprising:

a) a plurality of banks of random access memory (RAM);

b) an improved RAM addressing apparatus with reduced power consumption and noise generation coupled to said banks of RAM for addressing said banks of RAM, thereby conserving power available to said data instrumentation system, and reducing device package pins requirement of said data instrumentation system, said improved RAM addressing apparatus comprising:

b.1) address generator for generating sequential access addresses addressing said banks of RAM, each of said sequential access addresses comprising a plurality of address bits; and b.2) address converter coupled to said address generator for intercepting said generated sequential access addresses, converting said intercepted sequential access addresses into sequential access addresses with reduced number of address bit changes between successive access addresses;

b.3) address mapping means coupled to said address conversion means for receiving said converted sequential access addresses, and distributively mapping said received converted sequential access addresses to said banks of RAM; and b.d) a plurality of latches coupled to said address mapping means and correspondingly coupled to said banks of RAM for latching said distributively mapped converted sequential access addresses, and correspondingly providing the latched converted sequential access addresses to said banks of RAM.

12. The data instrumentation system set forth in claim 11, wherein, said address converter of said improved RAM addressing apparatus comprises a plurality of XOR gates coupled to said address generator for receiving said generated sequential access addresses, and converting said sequential access addresses into sequential access addresses with at most one address bit change between successive access addresses.

* * * * *

UNITED STATES PATENT AND TRADEMARK OFFICE
CERTIFICATE OF CORRECTION

PATENT NO.    : 5,410,664
DATED         : April 25, 1995
INVENTOR(S)   : Brooks et al.

It is certified that error appears in the above-identified patent and that said Letters Patent is hereby corrected as shown below:

In column 4, at line 25, insert --are-- between "apparatus" and "reduced".

In column 5, at line 12, delete "over" and substitute --by--.

Signed and Sealed this

Third Day of December, 1996

Attest:

BRUCE LEHMAN

Attesting Officer        Commissioner of Patents and Trademarks